(12) United States Patent
Manninen et al.

(10) Patent No.: US 7,028,230 B2
(45) Date of Patent: Apr. 11, 2006

(54) PARTIALLY FILLING BLOCK INTERLEAVER FOR A COMMUNICATION SYSTEM

(75) Inventors: Antti Manninen, Helsinki (FI); Frank Frederiksen, Klarup (DK)

(73) Assignee: Nokia Corporation, Espoo (FI)

( * ) Notice: Subject to any disclaimer, the term of this patent is extended or adjusted under 35 U.S.C. 154(b) by 441 days.

(21) Appl. No.: 10/281,290

(22) Filed: Oct. 25, 2002

(65) Prior Publication Data

US 2003/0091098 A1 May 15, 2003

Related U.S. Application Data

(60) Provisional application No. 60/337,976, filed on Nov. 5, 2001.

(51) Int. Cl.
*G11C 29/00* (2006.01)
(52) U.S. Cl. .................. 714/702; 714/762; 714/788
(58) Field of Classification Search ................ 714/100, 714/2, 4, 18, 762, 750, 787, 751, 788, 756, 714/761, 702, 755, 786, 757; 375/142, 296, 375/147; 370/335, 342
See application file for complete search history.

(56) References Cited

U.S. PATENT DOCUMENTS

| | | | | |
|---|---|---|---|---|
| 5,159,608 A | * | 10/1992 | Falconer et al. | 375/130 |
| 5,341,396 A | * | 8/1994 | Higgins et al. | 375/130 |
| 5,581,575 A | * | 12/1996 | Zehavi et al. | 375/142 |
| 5,822,359 A | * | 10/1998 | Bruckert et al. | 375/145 |
| 5,881,093 A | * | 3/1999 | Wang et al. | 375/130 |
| 6,104,709 A | * | 8/2000 | Rinchiuso et al. | 370/335 |
| 6,144,651 A | * | 11/2000 | Rinchiuso et al. | 370/335 |
| 6,397,368 B1 | | 5/2002 | Yonge, III et al. | |
| 6,601,209 B1 | * | 7/2003 | Lewis et al. | 714/756 |
| 6,714,597 B1 | * | 3/2004 | Antonio et al. | 375/296 |

OTHER PUBLICATIONS

*Interleaved Forward Error Correction for Variable Bit Rate Video Coding*, Hidenobu Harasake and Mitsuharu Yano, Information Technology Research Laboratories, NEC Corporation, IEEE 1994; pp. 225229.

*Channel interleaver modification for HSDPA*; TSG-RAN WG1 HSDPA adhoc meeting; Sophis Antipolis, France; Nov. 5-7, 2001.

*Enhanced Symbol Mapping method for the modulation of Turbo-coded bits based on bit priority*; 3GPP TSG RAN WG1/WG2 Joint Meeting on HSDPA; Sophia Antipolis, France; Apr. 5-6, 2001.

*3rd Generation Partnership Project; Technical Specification Group Radio Access Network; Multiplexing and channel coding (FDD)(Release 1999)*; 3GPP TS 25.212 V3.50; Dec. 2000.

* cited by examiner

*Primary Examiner*—Guy Lamarre
*Assistant Examiner*—Fritz Alphonse
(74) *Attorney, Agent, or Firm*—Ware, Fressole, Van Der Sluys & Adolphson LLP

(57) ABSTRACT

An interleaver (11b) for filling an interleaver matrix (51) used in interleaving a packet of bits for transmission as symbols via a wireless communication channel in a wireless communication system (11 12) including a modulator (11c), the interleaver (11b) having a number of rows (or columns, depending on whether bits are pulled column-wise or row-wise for encoding as symbols by the modulator) that is not divisible by the number of bits in a symbol, but having at least as many bits as in a packet, and so having, unavoidably, more elements than there are bits in a packet.

14 Claims, 6 Drawing Sheets

Fig. 2A

| 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 |
|---|---|---|---|---|---|---|---|---|---|---|---|---|---|---|---|---|---|---|---|---|---|---|---|---|---|---|---|---|---|
| 30 | 31 | 32 | 33 | 34 | 35 | 36 | 37 | 38 | 39 | 40 | 41 | 42 | 43 | 44 | 45 | 46 | 47 | 48 | 49 | 50 | 51 | 52 | 53 | 54 | 55 | 56 | 57 | 58 | 59 |
| 60 | 61 | 62 | 63 | 64 | 65 | 66 | 67 | 68 | 69 | 70 | 71 | 72 | 73 | 74 | 75 | 76 | 77 | 78 | 79 | 80 | 81 | 82 | 83 | 84 | 85 | 86 | 87 | 88 | 89 |
| 90 | 91 | 92 | 93 | 94 | 95 | 96 | 97 | 98 | 99 | 100 | 101 | 102 | 103 | 104 | 105 | 106 | 107 | 108 | 109 | 110 | 111 | 112 | 113 | 114 | 115 | 116 | 117 | 118 | 119 |
| 120 | 121 | 122 | 123 | 124 | 125 | 126 | 127 | 128 | 129 | 130 | 131 | 132 | 133 | 134 | 135 | 136 | 137 | 138 | 139 | 140 | 141 | 142 | 143 | 144 | 145 | 146 | 147 | 148 | 149 |
| 150 | 151 | 152 | 153 | 154 | 155 | 156 | 157 | 158 | 159 | 160 | 161 | 162 | 163 | 164 | 165 | 166 | 167 | 168 | 169 | 170 | 171 | 172 | 173 | 174 | 175 | 176 | 177 | 178 | 179 |
| ... | ... | ... | ... | ... | ... | ... | ... | ... | ... | ... | ... | ... | ... | ... | ... | ... | ... | ... | ... | ... | ... | ... | ... | ... | ... | ... | ... | ... | ... |

Fig. 2B

| 0 | 1 | 2 | 3 | 4 | 5 | 6 | 7 | 8 | 9 | 10 | 11 | 12 | 13 | 14 |
|---|---|---|---|---|---|---|---|---|---|---|---|---|---|---|
| 15 | 16 | 17 | 18 | 19 | 20 | 21 | 22 | 23 | 24 | 25 | 26 | 27 | 28 | 29 |
| 30 | 31 | 32 | 33 | 34 | 35 | 36 | 37 | 38 | 39 | 40 | 41 | 42 | 43 | 44 |
| 45 | 46 | 47 | 48 | 49 | 50 | 51 | 52 | 53 | 54 | 55 | 56 | 57 | 58 | 59 |
| 60 | 61 | 62 | 63 | 64 | 65 | 66 | 67 | 68 | 69 | 70 | 71 | 72 | 73 | 74 |
| 75 | 76 | 77 | 78 | 79 | 80 | 81 | 82 | 83 | 84 | 85 | 86 | 87 | 88 | 89 |
| 90 | 91 | 92 | 93 | 94 | 95 | 96 | 97 | 98 | 99 | 100 | 101 | 102 | 103 | 104 |
| 105 | 106 | 107 | 108 | 109 | 110 | 111 | 112 | 113 | 114 | 115 | 116 | 117 | 118 | 119 |
| ... | ... | ... | ... | ... | ... | ... | ... | ... | ... | ... | ... | ... | ... | ... |

66 rows

PARTIALLY FILLING BLOCK INTERLEAVER FOR A COMMUNICATION SYSTEM

CROSS REFERENCE To RELATED APPLICATION

Reference is made to and priority claimed from U.S. provisional application Ser. No. 60/337,976, filed Nov. 5, 2001, entitled PARTIALLY-FILLED BLOCK INTERLEAVER FOR SYSTEMS USING FORWARD ERROR CORRECTION AND HIGHER ORDER MODULATION.

TECHNICAL FIELD

The invention pertains to encoding a data stream for communication via a communication channel, especially a wireless communication channel, and more particularly to a modification of an interleaver so as to make the interleaver more useful for FEC (forward error correction) coded data streams modulating a carrier according to a higher order modulation scheme, such as QAM.

BACKGROUND ART

In a communication system in which the received signal is perturbed by noise, interference, and fading in the radio channel, errors occasionally occur. To combat this, some systems utilize forward error correction (FEC) schemes, like convolutional coding or Turbo coding, where redundant bits are added into the original data stream and transmitted over the communication link. Using this redundant information, the receiver can correct errors that have occurred. Normally the performance of FEC schemes is best when the errors are evenly distributed in the received data stream and have equal probability of occurring. However, this is not always the case in practice: errors occur often in bursts. For example, fading causes rapid variation in the attenuation of a radio channel when a receiver is moving, and the received power can vary by as much as 25 dB over a period as small as 10 ms at 30 km/h. The probability of error is very high for bits that are transmitted in "bad channel conditions" (for example, when the received power is smaller than −10 dB), but the probability of error in receiving other bits is small.

To address fading, interleaving is often used: the FEC-coded bits are "mixed" (interleave) before transmission in such a way that the probability of transmission during temporarily bad channel conditions is more evenly distributed in the FEC-coded data stream. A common method for interleaving is to use a so-called block interleaver: data are written into an interleaver matrix row-by-row and read out column-by-column. Block interleaving is useful when using simple QPSK modulation, but causes problems when using higher-order modulation schemes like 16-QAM. In higher-order schemes, the modulation itself causes differences in the error-probability between different bits. For example, when 16-QAM is used together with Gray mapping, the interleaved bits are mapped into reliable ("R") and unreliable ("U") positions as R-R-U-U-R-R-, and so on. This can lead to the situation in which the FEC-coded data stream is mapped into reliable and unreliable positions as clusters, or bursts, and the interleaver actually worsens the problem, i.e. it can group together (or cluster) bits having a high probability of error.

The inventors are unaware of the prior art having directly addressed the problem of clustering caused by interleaving when using a higher-order modulation scheme. However the inventors are aware of a suggestion of separately interleaving data bits (systematic bits) and redundancy bits (parity bits) and of then mapping as many of the systematic bits into reliable positions, which is an altogether different procedure than that provided by the invention.

Thus, to address clustering in case of interleaving when using higher order modulation schemes, what is needed is a modification of the prior art block interleaver that avoids clustering but leaves unchanged advantageous properties of the block interleaver.

DISCLOSURE OF THE INVENTION

Accordingly, in a first aspect of the invention, a method is provided for filling a matrix used in interleaving a packet of bits for transmission as symbols via a wireless communication channel, the transmission using a modulation scheme in which a number $n_{b/s}$ of bits are encoded per symbol, the matrix having a fixed number $n_1$ of elements in a first dimension and a variable number $n_2$ of elements in a second dimension, the method including sizing the matrix so as to accommodate the number $n_p$ of bits in the packet given the number $n_1$ of elements in the first dimension of the matrix, the first dimension being either a row or a column depending on whether the interleaving provides bits for modulation column-wise or row-wise, respectively, the method characterized in that it includes a step in which the number $n_2$ is adjusted to a number $n_2'$ that is not divisible by the number $n_{b/s}$ of bits per symbol, thereby providing a matrix that cannot be exactly filled by a packet of bits.

In accord with the first aspect, in the step of adjusting the number $n_2$ to the number $n_2'$, if the number $n_2'$ is less than $n_2$, then the number $n_1$ of the first dimension may be increased so that the matrix is again large enough to hold all of the bits of a packet, thereby providing a matrix that can be only partially filled by a packet of bits.

In a second aspect, the invention provides an interleaver for filling an interleaver matrix it creates spanning two dimensions and used in interleaving a packet of bits for transmission as symbols via a wireless communication channel, the interleaver for use in a wireless communication system including a modulator, the interleaver responsive to interleaver input bits ($x_0, x_1, \ldots$) and providing interleaver output bits ($y_0, y_1, \ldots$), the modulator using a predetermined modulation scheme for mapping the interleaver output bits ($y_0, y_1, \ldots$) into symbols ($s_0, s_1, \ldots$) with a predetermined number $n_{b/s}$ of bits per symbol, the interleaver characterized in that the matrix created by the interleaver has a fixed value $n_1$ indicating the size of the matrix in one dimension and an adjustable value $n_2$ indicating the size of the matrix in the other dimension with the value $n_2$ always adjusted so as not to be divisible by the number $n_{b/s}$ of bits per symbol and with the matrix created to be of a size large enough to hold all of the bits in a packet.

In a third aspect, an interleaver is provided for interleaving bits in a packet, the interleaving of the bits involving creating a two-dimensional array and then filling the array with the bits in a first way and extracting the bits in a different way, the interleaver characterized in that the two-dimensional array used by the interleaver is sized so as not to be able to hold exactly all of the bits in a packet or to hold exactly any integral multiple of all of the bits in a packet, but is at least large enough to hold all of the bits in one packet.

In a fourth aspect, the invention provides a system including transmitter elements that in turn include a forward error correction encoder, a modulator, and an interleaver for interleaving bits in a packet, the interleaving of the bits involving creating a two-dimensional array and then filling the array with the bits in a first way and extracting the bits in a different way, the interleaver characterized in that the two-dimensional array used by the interleaver is sized so as not to be able to hold exactly all of the bits in a packet or to hold exactly any integral multiple of all of the bits in a packet, but is sized to be at least large enough to hold all of the bits in one packet.

Further in accord with the fourth aspect, the system may also include receiver elements that in turn include a demodulator, a forward error correction decoder, and a de-interleaver for performing an operation on bits provided by the demodulator, an operation that is the inverse of the operations performed by the interleaver, with the de-interleaver using a de-interleaving matrix that is of the same dimension as the interleaving matrix. Further, the transmitter elements and receiver elements may be included in a base station for communicating with a plurality of wireless terminals, with the base station serving as an element of a radio access network. Further, the transmitter elements and receiver elements may also be included in a mobile wireless terminal for communicating with the base station. In addition, independently of what is included in a base station serving as an element of a radio access network, the transmitter elements and receiver elements may also be included in a mobile wireless terminal for communicating with the base station.

In a fifth aspect of the invention, a system is provided including transmitter elements that in turn include a forward error correction encoder, an interleaver as in the second aspect of the invention, and a modulator.

In accord with the fifth aspect of the invention, the system may also include receiver elements that in turn include a demodulator, a forward error correction decoder, and a de-interleaver for performing an operation on bits provided by the demodulator, an operation that is the inverse of the operations performed by the interleaver, with the de-interleaver using a de-interleaving matrix that is of the same dimension as the interleaving matrix. Further, the transmitter elements and receiver elements may be included in a base station for communicating with a plurality of wireless terminals, with the base station serving as an element of a radio access network. Further, the transmitter elements and receiver elements may also be included in a mobile wireless terminal for communicating with the base station. In addition, independently of what is included in a base station serving as an element of a radio access network, the transmitter elements and receiver elements may also be included in a mobile wireless terminal for communicating with the base station.

The invention provides a simple modification of a conventional block interleaver, a modification that reduces the average block error probability in case of interleaving with higher-order modulation. In case of HSDPA in 3GPP, a block interleaver per the invention can be designed in such a way that it can be used with all modulation schemes and code rates.

BRIEF DESCRIPTION OF THE DRAWINGS

The above and other objects, features and advantages of the invention will become apparent from a consideration of the subsequent detailed description presented in connection with accompanying drawings, in which:

FIG. 2A is a prior art block interleaver matrix with 30 columns.

FIG. 2B is a partially filled block interleaver for HSDPA, according to the invention.

BEST MODE FOR CARRYING OUT THE INVENTION

The occurrence of the clustering problem depends, on the number of elements in a colum of the interleaver matrix (having a given size). For example, in the case of 16-QAM modulation, clustering takes place if the number of rows (or at least the number of elements in a row) is divisible by 4 (which is the number of bits mapped into one symbol). Similarly, for 8-PSK or 64-QAM modulation, clustering takes place if the number of rows is divisible by 3 or 6, respectively. The main idea of this invention is to prevent the clustering problem by filling the interleaver matrix columns so that as few as possible of the columns have a number of elements that is divisible by whatever number would cause clustering (i.e. for example, are divisble by 4 in case of 16-QAM). This can be done by leaving some of the elements in the interleaver matrix empty, which can be done in an especially simple way in the case of some packet transmission schemes, like HSDPA in 3GPP, in which the number of symbols transmitted in one packet is fixed.

Figure 1:
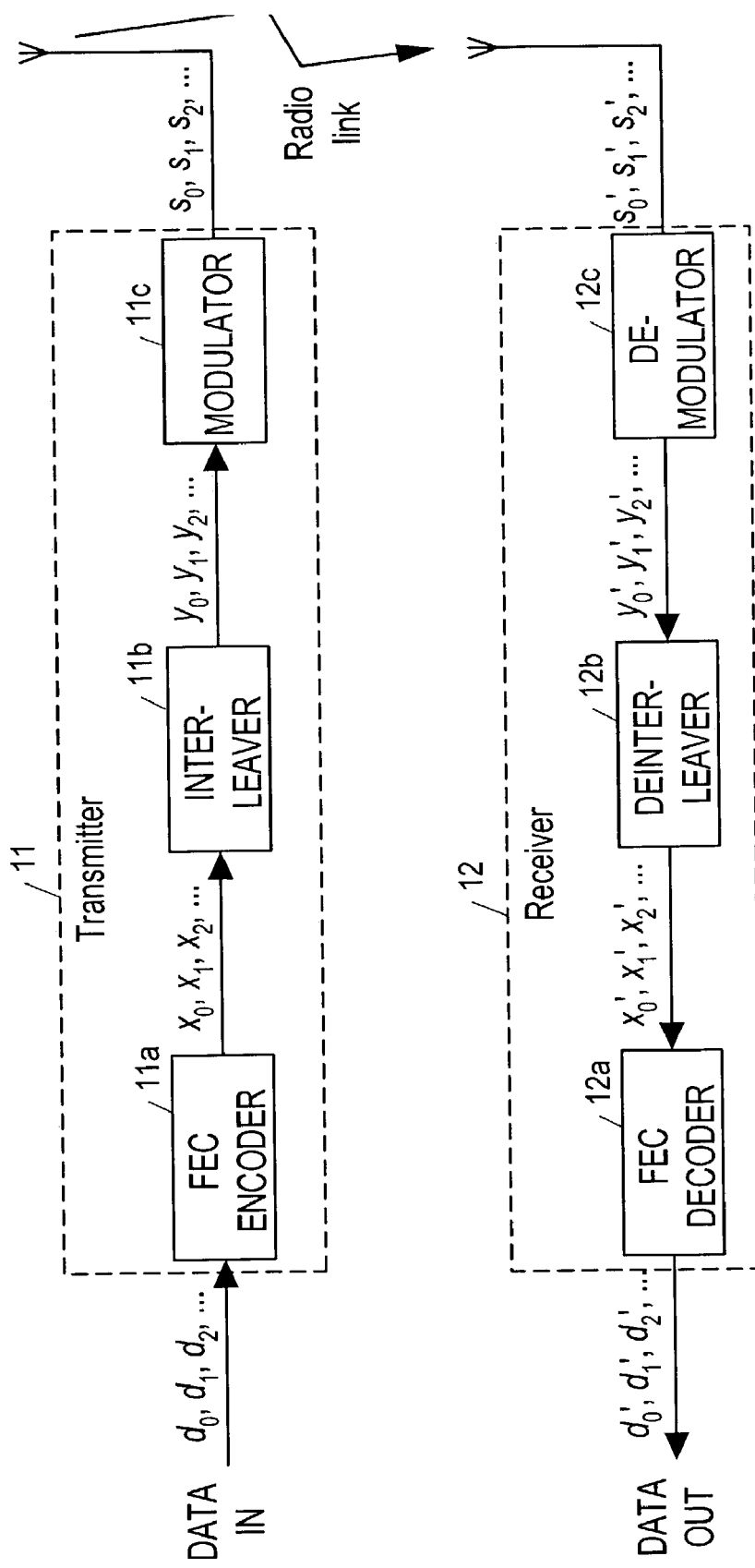
FIG. 1 is a simplified block diagram of a digital communication system with forward error correction and interleaving.

By way of background, FIG. 1 shows a simplified block diagram of a system employing channel coding (forward error correction) and interleaving. The system consists of a transmitter (11) and a receiver (12), both of which are implemented in both a mobile station and a base station of a telecommunication system. The original data, or systematic bits ($d_0, d_1, d_2, \ldots$), are encoded in the FEC encoder (11a) (e.g. Turbo encoder or convolutional encoder), in which redundancy bits, or parity bits, are added. If the code rate is 1/2, for example (i.e., the number of bits increases by a factor of two in FEC encoding), the output sequence of the FEC encoder ($x_0, x_1, x_2, \ldots$) is $d_0, p_0, d_1, p_1, \ldots$, where $d_i$ are the original data bits and $p_i$ are the added parity bits. The data are typically encoded in blocks which can contain several hundreds or thousands of bits. After encoding, the data are interleaved by an interleaver (11b), such as a block interleaver, which is the subject of the invention.

Still by way of background, FIG. 2A shows a block interleaver matrix (21) having 30 columns, into which FEC-encoded data are written row by row. The numbers in FIG. 2A correspond to the indices i of the input bits $x_i$. Data are read out columnwise, often from top to bottom, but the columns are not necessarily read out in order 0, 1, 2, . . . ; the read-out order of the columns can be permuted. As a concrete example, the number of columns in the interleaver matrix of the 2nd interleaver of 3GPP Release '99 is fixed to be 30, and the columns are read out in order 0, 20, 10, 5, 15, 25, 3, 13, 23, 8, 18, 28, 1, 11, 21, 6, 16, 26, 4, 14, 24, 19, 9, 29, 12, 2, 7, 22, 27, 17. In this case, the output of the interleaver ($y_0, y_1, y_2, \ldots$ in FIG. 2) is $x_0, x_{30}, x_{60}, \ldots, x_{20}$, $x_{50}, x_{80}, \ldots, x_{10}, x_{40}, x_{70}, \ldots$ using the FEC-coded input bits $x_i$.

Figure 3:
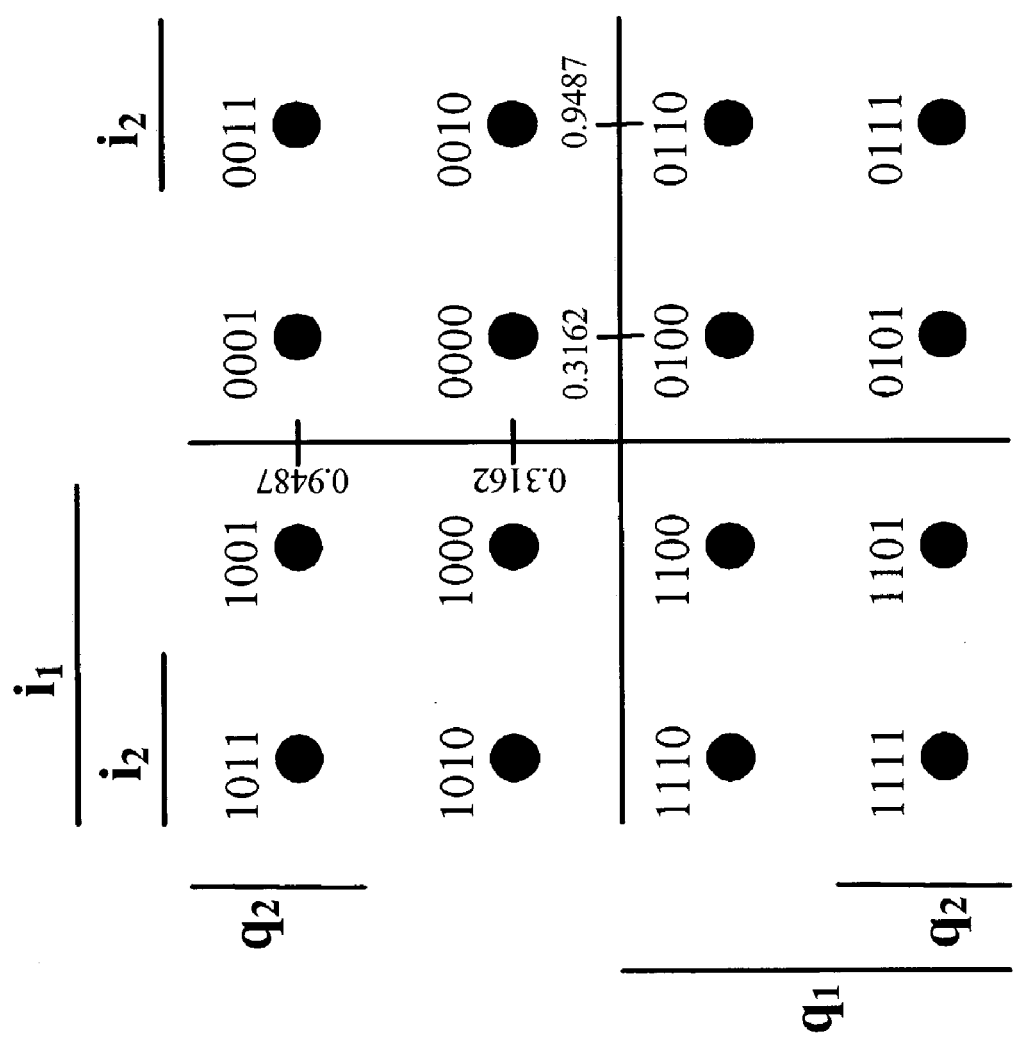
FIG. 3 is a depiction of a 16-QAM constellation.

After interleaving, the bits are modulated into symbols by modulator 11c. The simplest modulation scheme is BPSK (binary phase shift keying), in which each bit is mapped either into +1 (i.e., positive voltage) or −1 (negative voltage), depending on whether its value is 0 or 1. A slightly more complicated modulation scheme is QPSK (quaternary phase shift keying), in which the bits are mapped into pairs representing complex symbols (whose real and imaginary parts correspond to the in-phase and quadrature components of the radio signal). This can be done, for example, such that a bit pair 00 is mapped into a symbol 1+j (where j is the imaginary unit), 01 into 1−j, 10 into −1+j, and 11 into −1−j. Our invention relates to modulation schemes of higher-order than QPSK, such as 8-PSK, 16-QAM, (quadrature amplitude modulation) and 64-QAM. A common feature of such schemes is that some of the bits can be mapped into "more reliable positions" than others. Let us consider 16-QAM modulation as an example. In this case, four interleaved bits ($y_i$ in FIG. 2) are mapped into one symbol as shown in FIG. 3, when gray mapping is used. (Gray mapping, or Gray coding, is a mapping, as indicated by a symbol constellation such as in FIG. 3, that provides that between a given symbol point and its nearest neighbors, the fewest possible bits change value. Such a mapping minimizes the bit error rate for uncoded bits.) For example, bit-sequence 1001 would be mapped into a symbol −0.3162+0.9487j when scaling is done in such a way that the average power of transmitted symbols is 1, using the rule that the first and second bits from the left determine, respectively, the sign of the real and imaginary parts of the symbol, and the third and fourth bits determine the magnitude of the real and imaginary parts, respectively. Because the determination of sign is much more reliable than determination of the magnitude in the receiver, the first two bits are more "reliable" than the third and fourth ones. Thus, the interleaved bits ($y_0, y_1, y_2, \ldots$ in FIG. 1) are mapped into reliable ("R") and unreliable ("U") positions as R-R-U-U-R-R-U-U- . . . with a period of 4 bits. In the case of 8-PSK, in which three bits are mapped into one symbol, mapping into reliable and unreliable positions has a period of 3 bits: R-R-U-R-R-U- . . . . In a similar way, the period in the case of 64-QAM modulation is 6 bits, because 6 bits are mapped into one symbol: R-R-M-M-U-U-R-R-M-M-U-U- . . . , where "M" means mapping into a "middle reliability" position, i.e., better than "U" but worse than "R".

The modulated symbols are transmitted to the receiver via a communication link, e.g. a radio channel, and in the receiver the operations corresponding to those described above are performed in opposite order. First the received symbols are demodulated into "soft bits" ($y_0', y_1', y_2', \ldots$ in FIG. 1) in such a way that, typically, positive numbers correspond to bit value 0 and negative numbers to bit value 1. The more reliable the estimation, the larger the absolute value of the soft bit. Next the soft bits are de-interleaved by a deinterleaver 12B using a matrix identical to what was used in transmission, but now the data are written columnwise in the same order as the data were transmitted, and the deinterleaved bits ($x_0', x_1', x_2', \ldots$ in FIG. 1) are read out from the matrix row by row. The final values of the received bits ($d_0', d_1', d_2', \ldots$) are determined in the FEC decoder 12a.

Figure 4:
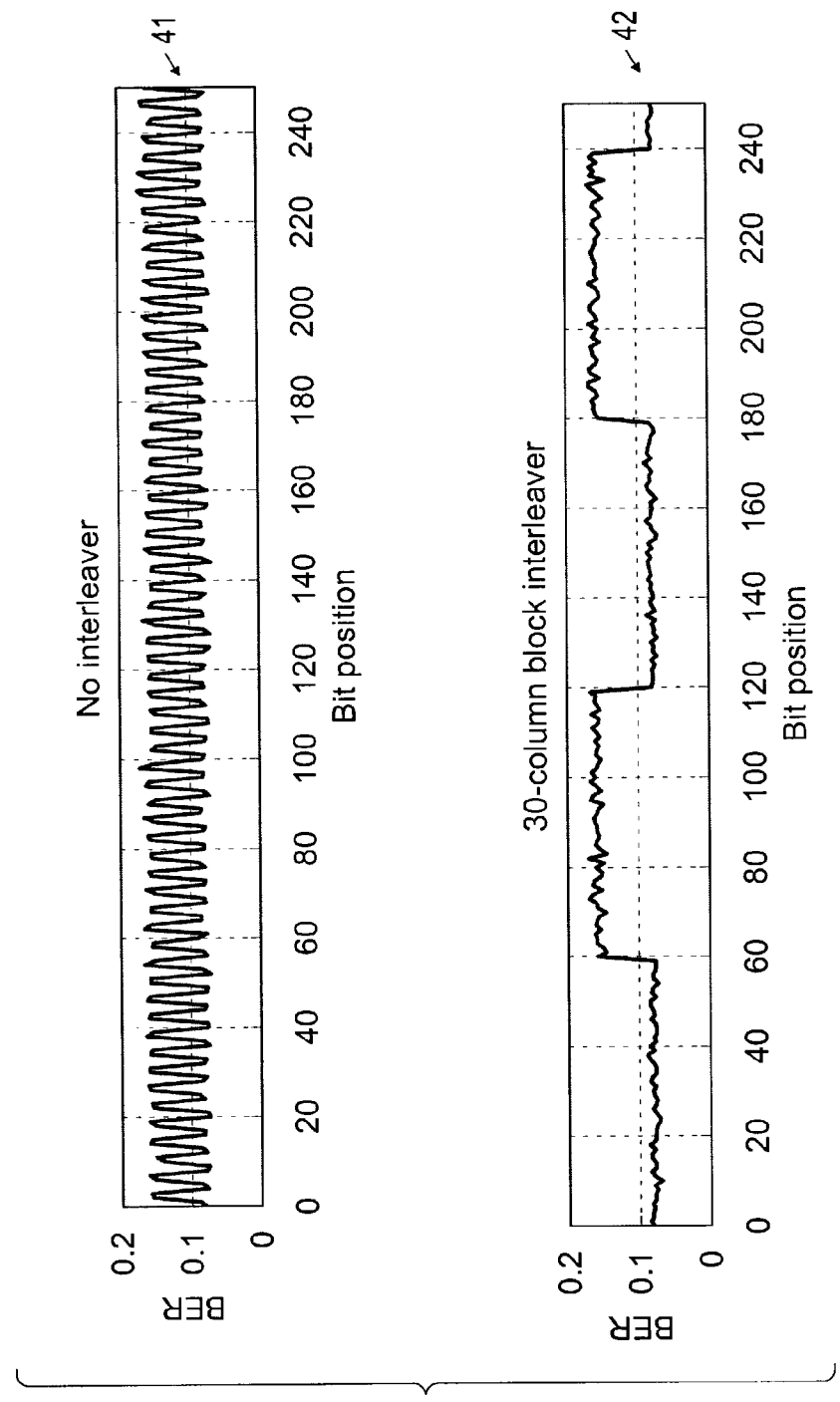
FIG. 4 is a set of graphs showing the error rate of FEC-coded bits as a function of bit position when no interleaver-is used and when a 30-column block interleaver is used.

Now, in case of 16 QAM, if the second interleaver of 3GPP Release '99 for HSDPA packets is used, then the FEC coded data are mapped into reliable and unreliable positions in clusters of 60 bits. Each HSDPA packet consists of 3 slots, each of which contains 160 symbols using a spreading factor of 16. Because each 16-QAM symbol contains 4 bits, the number of bits in one HSDPA packet (per spreading code) is 3×4×160=1920. The 1920 bits fill exactly 64 rows of the interleaver matrix, which has 30 columns. When the data ($y_0, y_1, y_2, \ldots$ in FIG. 1) are read out columnwise, they are mapped (interleaved) into reliable and unreliable positions as R-R-U-R-R-U-U- . . . , as was explained earlier. Because each column has 64 elements, which is divisible by 4, all bits from the two top rows of the interleaver (which contain the first 60 bits from the FEC-coded data stream $x_0$, $x_1, x_2, \ldots$) are mapped into reliable positions, all bits from the next two rows (which contain the next 60 bits from the FEC-coded data stream) into unreliable positions, and so on. Thus, the bits of the FEC-coded data stream are mapped into reliable and unreliable positions in clusters of 60 bits, and thus interleaving causes bursts of unreliable bits. This is exactly opposite to what the interleaver should do; an interleaver should remove bursts, not cause them. The clustering problem caused by the interleaver is illustrated in FIG. 4, in which the simulated bit-error probability is indicated as a function (graphs 41 and 42) of bit position in the FEC-coded data stream ($x_0, x_1, x_2, \ldots$ in FIG. 1) both when no interleaving is used (graph 41) and when the 2nd interleaver of 3GPP Release '99 is used (graph 42). In the former case, the R-R-U-U- . . . pattern is evident, and the latter case shows clearly the formation of the 60-bit clusters due to the block interleaver being used in combination with 16 QAM.

The same clustering problem would exist in HSDPA with other higher-order modulation schemes, besides 16 QAM. With 8-PSK modulation, each symbol contains 3 bits, and the number of bits in one HSDPA packet is 3×3×160=1440 (using a spreading factor of 16), which fill exactly 48 rows of a 30-column interleaver matrix. Because 48 is divisible by 3 and because the reliability of bits with 8-PSK has the pattern R-R-U-R-R-U- . . . , all bits in rows 2, 5, 8, . . . , of the interleaver matrix are mapped into unreliable positions. Thus, the bits of the FEC-coded data stream are mapped into unreliable positions in clusters of 30 bits. In a similar way, each 64-QAM modulated symbol contains 6 bits, and each HSDPA packet contains 3×6×160=2880 bits which fill exactly a 30-column interleaver matrix with 96 rows. Because 96 is divisible by 6, the clustering problem exists with 64-QAM modulation, too.

The invention solves the clustering problem by filling the interleaver matrix in such a way that the number of bits in none of the rows is divisible by 4 in case of 16-QAM modulation (or by 3 for 8-PSK, or by 6 for 64-QAM, and so on). In the case of HSDPA, this can be done in a very simple way: by leaving empty, for example, 15×4 elements in one of the corners of the 30-column interleaver matrix 22 as shown in FIG. 2B. When this is done, the number of rows in the interleaver matrix 22 increases by 2 (compared to the prior art interleaver matrix 21), from 64 to 66 in case of 16-QAM modulation, because all 1920 bits must fit into the matrix. Thus, the number of bits is 66 in 15 (full) columns and 62 in 15 (partially empty) columns. Neither of these numbers (66 or 62) is divisible by 4, but both of them are divisible by 2. The bits from the first-read column are mapped into reliable and unreliable positions as R-R-U-U- . . . U-U-R-R, and the elements from the next column are mapped as U-U-R-R- . . . R-R-U-U, and so on. Thus, half of the bits on each row are mapped into reliable and half of the bits into unreliable positions, and the clustering problem is avoided.

For the best performance, one should make sure that the columns are read out in a "sensible" order, i.e. so as not to cause clustering. For example, if the inter-column permutation pattern in a 30-column interleaver matrix were such that the columns were read out in order 0, 15, 1, 16, 2, 17, . . . , the first 15 elements from each row would be mapped into a position with the same reliability (either "R" or "U"), and the last 15 elements of each row would have the opposite reliability. Thus, clusters of 15 bits would form. The inter-column permutation pattern of the 2nd interleaver of 3GPP Release '99 is "sensible" in that it happens not to cause such clustering; at most 4 subsequent bits of the FEC-coded data stream are mapped into a position with the same reliability in 16-QAM.

The interleaver structure of FIG. 2B is not limited to the case of 16-QAM modulation. As was pointed out earlier, the 2nd interleaver of 3GPP Release '99 causes the clustering problem in the case of 8-PSK and 64-QAM modulation, too, because the number of rows in the interleaver is divisible by the number of bits contained in one symbol. The partially filled structure of FIG. 2B avoids the clustering problem. In the interleaver of FIG. 2B, the number of bits in none of the columns is divisible by the number of bits contained in one symbol, even in the case of HSDPA with 8-PSK or 64-QAM or any other basic higher-order modulation scheme. Using such a modified interleaver matrix does not give any gain in the case of QPSK modulation, but it does not cause any deterioration of performance, either. Note also that the empty block of 15×4 elements in the top right corner of the interleaver matrix is just one way from among many according to the invention to avoid the clustering problem. For example, a block of 15×2 empty elements (which would mean that the number of elements in each column is odd in the case of HSDPA with 16-QAM modulation) could be used as well.

The simple form of the partially filled block interleaver shown in FIG. 2B is suitable when the number of bits in the interleaved data packet is such that the packet would fill a simple block interleaver matrix in which the number of rows is divisible by the number of bits in the symbol, i.e. when the clustering problem is most pronounced, as is the case for HSDPA. The idea of ensuring that the number of bits in none of the columns of the matrix is divisible by the number of bits in a modulation symbol can be used in a more general case, as well, but then the number and location of empty elements must be determined separately for each different size of data packet.

Figure 5:
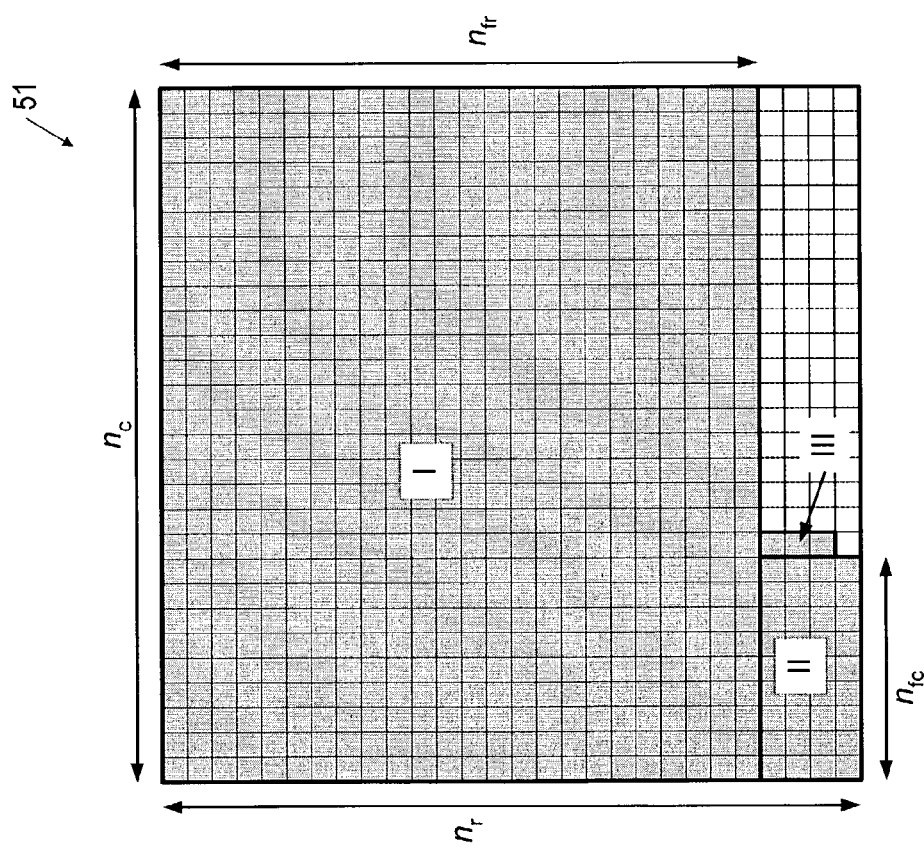
FIG. 5 is a general interleaver matrix filled according to the invention.

One possible structure for the general case is shown in FIG. 5, in which the shaded parts are filled and the unshaded parts are empty elements. In this example, the empty elements are those in the bottom right corner of the matrix, (region IV) unlike in FIG. 2B, where they are located in the top right corner.

Still referring to FIG. 5, in general, assuming that the number $n_c$ of columns in the interleaver matrix 51, is fixed, we select the number $n_r$ of rows, according to the number of bits in the packet, N in such a way that $n_r$ does not have a "bad" value, i.e., $n_r$ is not divisible by 3, 4, or 6 in the case of 8-PSK, 16-QAM, or 64-QAM, for example, and that all bits of the packet fit into the interleaver matrix. Next, the number of full rows, $n_{fr}$ in FIG. 5, is selected, again in such a way that its value is not "bad". Then the number of full columns, $n_{fc}$, is selected in such a way that the bits fit into regions I and II of FIG. 5, except possibly for a few "extra" bits must be fit into one column in region III of FIG. 5. The interleaver is filled in the normal way, row by row, but the elements outside the shaded region of FIG. 5 are left empty. Output is read column-wise, as normally, and possibly in a permuted order. In this way, the number of elements in none of the columns (except possibly for the one which includes region III) has a "bad" value, and the clustering problem is thereby avoided.

Figure 6:
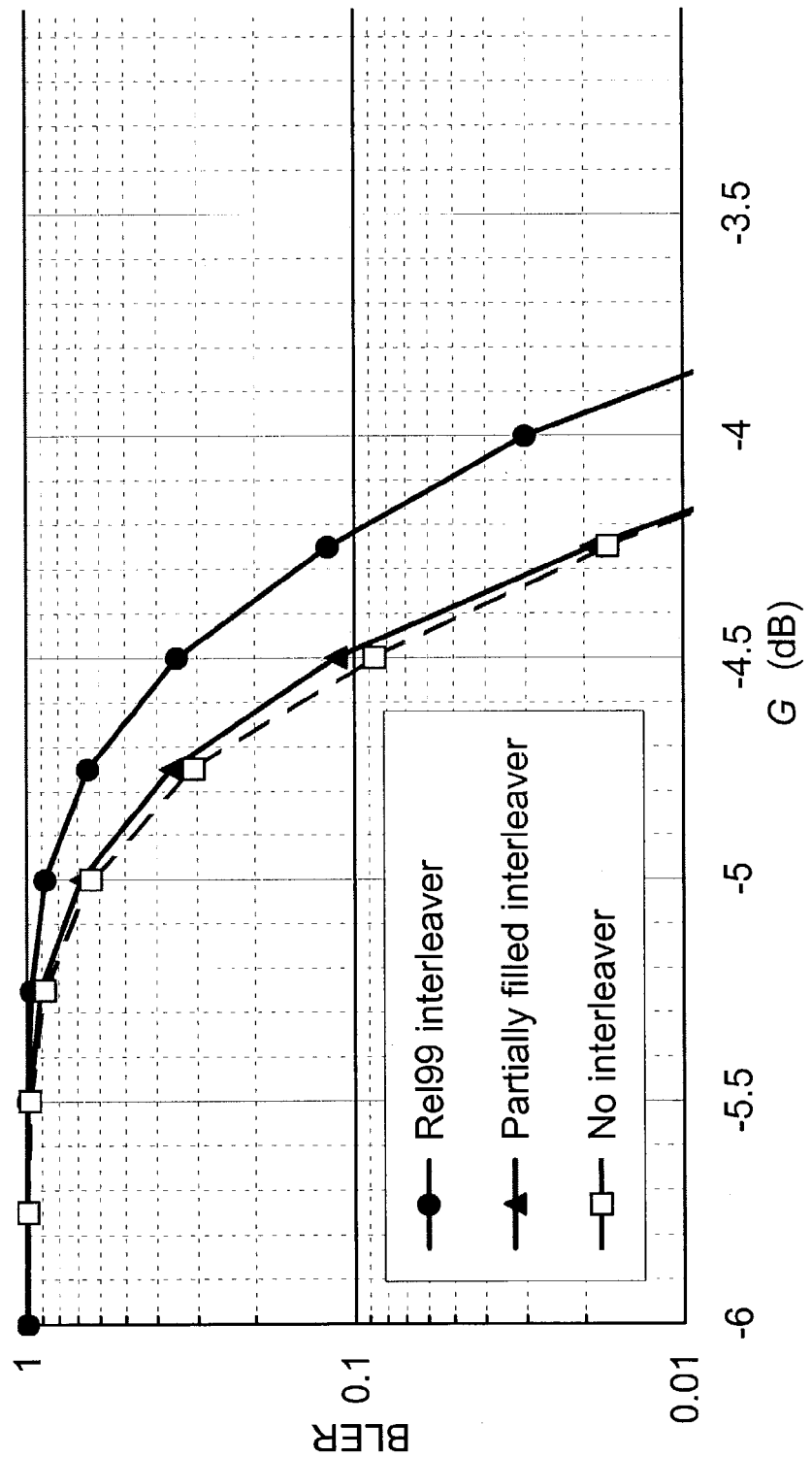
FIG. 6 is a graph of the block error rate of HSDPA packets with 16-QAM modulation in an AWGN channel as a function of geometry G using the second interleaver of 3GPP Release '99 (filled circles, solid line), and using a partially filled interleaver according to the invention (filled triangles, solid line), and finally, when no interleaver is used at all (open squares, dashed line).

A comparison of a partially filled interleaver according to the invention, with the 2nd interleaver of 3GPP Release '99 in an AWGN (Additive White Gaussian Noise) channel for 16-QAM modulation is presented in FIG. 6, showing link simulation results of the error rate of HSDPA packets vs. geometry G, which is defined as the ratio between the received own-cell power and other-cell interference. The length of the HSDPA packet was 3 slots (2 ms), and a turbo coder with rate 1/2 was used for FEC coding. HSDPA power was 80% (i.e., −1 dB) of the total power of the cell. As a reference, FIG. 6 shows the performance without any interleaver. Note that interleaving is not needed in an AWGN channel, and the system works best without an interleaver. We see from FIG. 6 that the 2nd interleaver of Release '99 degrades the performance by about 0.3 dB compared to using no interleaver at all. This degradation is caused by the clustering problem as explained above. The partially filled interleaver gives a performance gain of more than 0.2 dB compared to the Release '99 interleaver, and the performance approaches that obtained without interleaving.

From other simulation studies, the inventors have determined that the performance gain of a partially filled interleaver according to the invention can be more than 0.2 dB compared to the "full" 2nd interleaver of 3GPP Release '99 at low mobile station velocities. The partially filled interleaver has some gain compared to the Release '99 interleaver even at 120 km/h, which indicates that "clipping" of the matrix does not cause any deterioration of actual interleaving properties.

Although in the above description the interleaver matrix is "partially filled" in order to avoid the clustering problem, the invention also encompasses filling with "dummy bits" what would be empty elements according to the above description.

Figure 7:
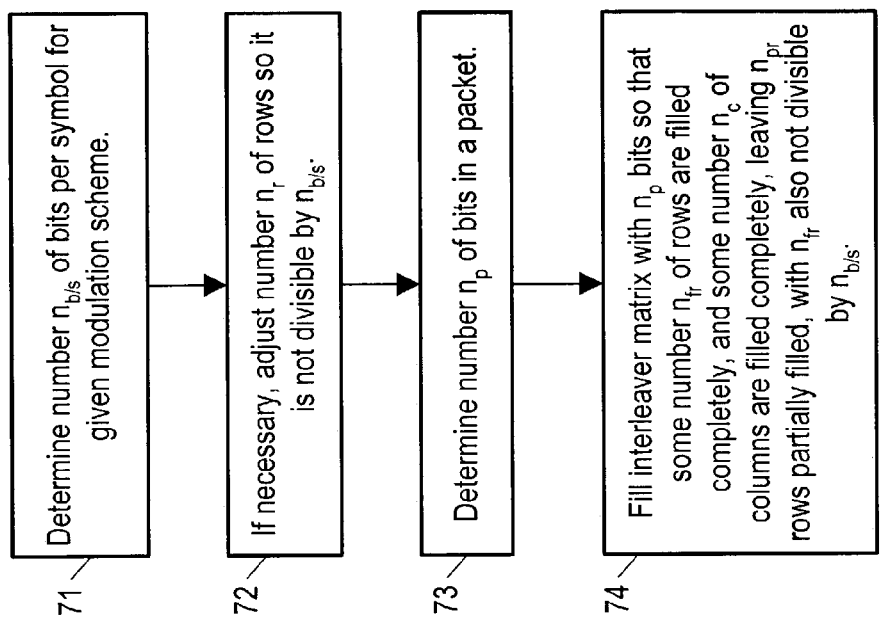
FIG. 7 is a flow chart showing how a block interleaver fills an interleaver matrix, according to the invention.

Referring now to FIG. 7, the invention is shown in terms of a flowchart for the procedure used by the interleaver 11b (FIG. 1) in filling the interleaver matrix 51 (FIG. 5) with the bits of a packet. In a first step 71, (executed only once, not for each packet), the number $n_{b/s}$ of bits per symbol according to the modulation scheme in use is determined. In a next step 72 (again, executed only once, not for each element), the number $n_r$ rows of the interleaver matrix is adjusted (if necessary) so that it is not divisible (without remainder) by $n_{b/s}$. In a next step 73, the number $n_p$ of bits in a packet is determined (once). Then, for each packet, as a next step 74, the interleaver matrix is filled (by the interleaver before providing the interleaver output $y_0, y_1, \ldots$ of FIG. 1) with $n_p$ bits by filling some number $n_{fr}$ of rows completely (with $n_c$ bits where $n_c$ is the given number of columns of the interleaver matrix) and some number $n_{pr}=n_r-n_{fr}$ of rows only partially, where $n_{fr}$ is also not divisible by $n_{b/s}$, and filling the matrix in such a way as to provide $n_{fc}$ filled columns and $n_{fr}$ filled rows and possibly one column filled with a number of bits intermediate between $n_r$ and $n_{fr}$.

It should be understood that the invention also encompasses a procedure identical to the above, but where the filling of rows of the interleaver matrix 51 is replaced with the filling of columns, in case of an interleaver operating so as to pull bits out of the interleaver matrix row-by-row, instead of column-to-column, as in the above description. It should also be understood that the invention also comprehends filling the interleaver matrix so as not to leave an unbroken region of empty elements (such as region IV of FIG. 5), but instead filling the matrix so that the partially filled columns are interspersed, or the partially filled rows are interspersed. Further, the invention also comprehends first increasing the number of columns and then decreasing the number of rows to a number not divisible by $n_{b/s}$, but such that the matrix is still large enough to accommodate all of the bits in a packet.

The invention is part of the implementation of the physical layer of a communication system, and should be implemented in the hardware handling the interleaving prior to modulation and deinterleaving after the demodulation, in the same way as the 2nd interleaver of 3GPP Technical Specification, Release '99.

SCOPE OF THE INVENTION

It is to be understood that the above-described arrangements are only illustrative of the application of the principles of the present invention. Numerous modifications and alternative arrangements may be devised by those skilled in the art without departing from the scope of the present invention, and the appended claims are intended to cover such modifications and arrangements.

What is claimed is:

1. A method for filling a matrix (51) used in interleaving a packet of bits for transmission as symbols via a wireless communication channel, the transmission using a modulation scheme in which a number $n_{b/s}$ of bits are encoded per symbol, the matrix having a fixed number $n_1$ of elements in a first dimension and a variable number $n_2$ of elements in a second dimension, the method including sizing the matrix so as to accommodate the number $n_p$ of bits in the packet given the number $n_1$ of elements in the first dimension of the matrix, the first dimension being either a row or a column depending on whether the interleaving provides bits for modulation column-wise or row-wise, respectively, the method characterized in that it includes a step (72) in which the number $n_2$ is adjusted to a number $n_2'$ that is not divisible by the number $n_{b/s}$ of bits per symbol, thereby providing a matrix that cannot be exactly filled by a packet of bits.

2. A method as in claim 1, further characterized in that in the step (72) of adjusting the number $n_2$ to the number $n_2'$, if the number $n_2'$ is less than $n_2$, then the number $n_1$ of the first dimension is increased so that the matrix is again large enough to hold all of the bits of a packet, thereby providing a matrix that can be only partially filled by a packet of bits.

3. An interleaver (11b) for filling an interleaver matrix (51) it creates spanning two dimensions and used in interleaving a packet of bits for transmission as symbols via a wireless communication channel, the interleaver (11b) for use in a wireless communication system (11 12) including a modulator (11c), the interleaver responsive to interleaver input bits ($x_0, x_1, \ldots$) and providing interleaver output bits ($y_0, y_1, \ldots$), the modulator (11c) using a predetermined modulation scheme for mapping the interleaver output bits ($y_0, y_1, \ldots$) into symbols ($s_0, S_1, \ldots$) with a predetermined number $n_{b/s}$ of bits per symbol, the interleaver (11b) characterized in that the matrix (51) created by the interleaver (11b) has a fixed value $n_1$ indicating the size of the matrix (51) in one dimension and an adjustable value $n_2$ indicating the size of the matrix (51) in the other dimension with the value $n_2$ always adjusted so as not to be divisible by the number $n_{b/s}$ of bits per symbol and with the matrix (51) created to be of a size large enough to hold all of the bits in a packet.

4. A system, including transmitter elements (11), the transmitter elements (11) in turn including a forward error correction encoder (11a), an interleaver (11b) as in claim 3, and a modulator (11c).

5. A system as in claim 4, further including receiver elements (12), the receiver elements (12) in turn including a demodulator (12c), a forward error correction decoder (12a), and a de-interleaver (12b) for performing an operation on bits provided by the demodulator (12c), the operation being the inverse of the operations performed by the interleaver (11b) with the de-interleaver using a de-interleaving matrix (51) that is of the same dimension as the interleaving matrix (51).

6. The system as in claim 5, wherein the transmitter elements (11) and receiver elements (12) are included in a base station for communicating with a plurality of wireless terminals, the base station serving as an element of a radio access network.

7. The system as in claim 5, wherein the transmitter elements (11) and receiver elements (12) are included in a mobile wireless terminal for communicating with a base station serving as an element of a radio access network.

8. The system as in claim 6, wherein the transmitter elements (11) and receiver elements (12) are also included in a mobile wireless terminal for communicating with the base station.

9. An interleaver (11b) for interleaving bits in a packet, the interleaving of the bits involving creating a two-dimensional array (51) and then filling the array (51) with the bits in a first way and extracting the bits in a different way, the interleaver (11b) characterized in that the two-dimensional array used by the interleaver (11b) is sized so as not to be able to hold exactly all of the bits in a packet or to hold exactly any integral multiple of all of the bits in a packet, but is sized to be at least large enough to hold all of the bits in one packet.

10. A system, including transmitter elements (11), the transmitter elements (11) in turn including a forward error correction encoder (11a), a modulator (11c), and an interleaver (11b) for interleaving bits in a packet, the interleaving of the bits involving creating a two-dimensional array (51) and then filling the array (51) with the bits in a first way and extracting the bits in a different way, the interleaver (11b) characterized in that the two-dimensional array used by the interleaver (11b) is sized so as not to be able to hold exactly all of the bits in a packet or to hold exactly any integral multiple of all of the bits in a packet, but is sized to be at least large enough to hold all of the bits in one packet.

11. A system as in claim 10, further including receiver elements (12), the receiver elements (12) in turn including a demodulator (12c), a forward error correction decoder (12a), and a de-interleaver (12b) for performing an operation on bits provided by the demodulator (12c), the operation being the inverse of the operations performed by the interleaver (11b), with the de-interleaver using a de-interleaving matrix (51) that is of the same dimension as the interleaving matrix (51).

12. The system as in claim 11, wherein the transmitter elements (11) and receiver elements (12) are included in a base station for communicating with a plurality of wireless terminals, with the base station serving as an element of a radio access network.

13. The system as in claim 12, wherein the transmitter elements (11) and receiver elements (12) are also included in a mobile wireless terminal for communicating with the base station.

14. The system as in claim 11, wherein the transmitter elements (11) and receiver elements (12) are included in a mobile wireless terminal for communicating with a base station serving as an element of a radio access network.

* * * * *